United States Patent
Park et al.

(10) Patent No.: US 6,893,889 B2
(45) Date of Patent: May 17, 2005

(54) METHOD FOR MANUFACTURING GALLIUM NITRIDE-BASED SEMICONDUCTOR LIGHT EMITTING DEVICE

(75) Inventors: Young Ho Park, Kyungki-do (KR); Hun Joo Hahm, Kyungki-do (KR); Soo Min Lee, Seoul (KR)

(73) Assignee: Samsung Electro-Mechanics Co., Ltd., Kyungei-do (KR)

( * ) Notice: Subject to any disclaimer, the term of this patent is extended or adjusted under 35 U.S.C. 154(b) by 0 days.

(21) Appl. No.: 10/735,615

(22) Filed: Dec. 16, 2003

(65) Prior Publication Data

US 2004/0266044 A1 Dec. 30, 2004

(30) Foreign Application Priority Data

Jun. 24, 2003 (KR) .................. 10-2003-0041173

(51) Int. Cl.[7] ...................... H01L 29/06; H01L 31/109; H01L 31/0336
(52) U.S. Cl. .......................... 438/22; 438/34
(58) Field of Search .............. 257/79, 90, 99, 257/100, 744, 745; 438/22, 29, 34, 42

(56) References Cited

U.S. PATENT DOCUMENTS 5,563,422 A    10/1996   Nakamura et al.
2003/0077847 A1 *  4/2003   Yoo .......................... 438/22

* cited by examiner

*Primary Examiner*—Evan Pert
*Assistant Examiner*—Asok Kumar Sarkar
(74) *Attorney, Agent, or Firm*—Lowe Hauptman & Berner, LLP

(57) ABSTRACT

A method of manufacturing a gallium nitride-based semiconductor light emitting device, includes sequentially forming, over a substrate, a first conductivity type clad layer, an active layer, and a second conductivity type clad layer, forming a transparent electrode over the second conductivity type clad layer, forming a photoresist film on the transparent electrode such that the transparent electrode is exposed at a predetermined region, removing respective portions of the transparent electrode, second conductivity type clad layer, and active layer corresponding to the predetermined region, thereby partially exposing the first conductivity type clad layer, removing the photoresist film, and forming first and second bonding electrodes on predetermined portions of the transparent electrode and second conductivity type clad layer, respectively.

7 Claims, 3 Drawing Sheets

(a)

(b)

(c)

METHOD FOR MANUFACTURING GALLIUM NITRIDE-BASED SEMICONDUCTOR LIGHT EMITTING DEVICE

BACKGROUND OF THE INVENTION

1. Field of the Invention

The present invention relates to a method for manufacturing a semiconductor light emitting device, and more particularly to a semiconductor light emitting device manufacturing method which can achieve an improvement in the bonding force of electrodes while reducing the number of photoresist and lithography processes to be carried out, by unifying processes for forming electrode and mesa structures, thereby simplifying those processes.

2. Description of the Related Art

In recent years, display of full range color has been realized in accordance with development of light emitting devices capable of emitting blue, green, and ultraviolet rays, utilizing a gallium nitride (GaN)-based compound semiconductor.

GaN-based compound semiconductor crystals may be grown over an insulating substrate such as a sapphire substrate. For this reason, in the case of a GaN-based light emitting device, it is impossible to arrange an electrode on the back surface of a substrate. Therefore, both electrodes of the light emitting device must be formed at the side of a semiconductor layer grown over the substrate.

To this end, it is necessary to use a process for forming a mesa structure in which its upper clad layer and active layer are partially removed to partially expose the upper surface of a lower clad layer.

Furthermore, it is necessary to provide an additional layer so that an ohmic contact is formed by a typical electrode, because the upper clad layer, which is made of a p type GaN layer, has a relatively high resistance. For example, a transparent electrode made of Ni/Au is formed prior to formation of a bonding electrode on a p type GaN layer, thereby forming an ohmic contact for reducing a forward voltage Vf, as disclosed in U.S. Pat. No. 5,563,422 (Assignee: Nichia Chemical Industries, Ltd.; and Date of Patent: Oct. 8, 1996). For such a transparent electrode, an indium titanium oxide (ITO) film may be used.

Thus, the above mentioned GaN-based semiconductor light emitting device requires complex processes for forming a mesa structure and an electrode structure, because of the insulating property of its substrate for growth of GaN-based crystals. For this reason, there is a difficulty caused by an increase in respective numbers of photoresist processes, photoresist removal processes, and deposition processes to be carried out for formation of the mesa structure and electrode structure. The complexity of such processes may be identified through exemplary processes of FIGS. 1a to 1i.

FIGS. 1a to 1i are sectional views respectively illustrating processes of a conventional method for manufacturing a GaN-based semiconductor light emitting device.

In accordance with this semiconductor light emitting device manufacturing method, a primary growth process is first carried out to sequentially form, over a sapphire substrate 11, a first conductivity type clad layer 13, an active layer 15, and a second conductivity type clad layer 17, as shown in FIG. 1a. The crystalline semiconductor layers 13, 15, and 17 may be grown in accordance with an appropriate process such as a metal oxide chemical vapor deposition (MOCVD) process.

Thereafter, a process for forming a mesa structure is carried out in order to form bonding electrodes on the upper surface of the first conductivity type clad layer 13, as shown in FIGS. 1b and 1c. In the mesa structure forming process, a photoresist film 21 is first formed on the second conductivity type clad layer 15 at a region other than a region where the second conductivity type clad layer 15 is to be etched, as shown in FIG. 1b.

Thereafter, the second conductivity type clad layer 17 and active layer 15 are partially etched to partially expose the first conductivity type clad layer 13, as shown in FIG. 1c. Thus, a mesa structure is formed.

After removing the photoresist film 21 used to form the mesa structure, a photoresist film 22 for formation of a transparent electrode is formed on the resultant structure such that the second conductivity type clad layer 17 is partially exposed at its upper surface, as shown in FIG. 1d. The second conductivity type clad layer 17 is covered by the photoresist film 22 at its edge portions so that the edge portions are prevented from coming into contact with an electrode to be subsequently formed adjacent to the second conductivity type clad layer 17.

Subsequently, a transparent electrode 18 is formed at a desired region on the second conductivity type clad layer 17 by use of the photoresist film 22, as shown in FIG. 1e.

Thereafter, a process for forming bonding electrodes 19a and 19b on the transparent electrode 18 and the first conductivity type clad layer 13 is carried out, as shown in FIGS. 1f to 1i. In order to form the first bonding electrode 19a, a photoresist film 23 is formed such that the first conductivity type clad layer 13 is partially exposed, as shown in FIG. 1f. After formation of the first bonding electrode 19a, the photoresist film 23 is removed, as shown in FIG. 1g. Similarly, a photoresist film 24 is formed such that the transparent electrode 18 is partially exposed, in order to form the second bonding electrode 19b, as shown in FIG. 1h. After formation of the second bonding electrode 19b, the photoresist film 24 is removed, as shown in FIG. 1i.

Thus, it is necessary to perform the photoresist process and photoresist removal process four times for formation of the mesa structure, transparent electrode, and first and second bonding electrodes, respectively, in order to form a GaN-based semiconductor light emitting device. Furthermore, each process is complex because it involves a separate deposition process. Additionally, a process for forming a passivation layer is involved in the practical fabrication of semiconductor light emitting devices. For this reason, one photoresist process and one photoresist removal process are required, as shown in FIGS. 2a and 2b.

In accordance with a conventional process for forming a passivation layer of a semiconductor light emitting device, a passivation layer 20 made of $SiO_2$ or SiN is formed over the light emitting structure obtained after completion of the process shown in FIG. 1i, as shown in FIG. 2a. Thereafter, a photoresist film 25 is formed on the passivation layer 20 such that it does not cover regions where the bonding electrodes 19a and 19b are formed, as shown in FIG. 2b. The passivation layer 20 is then selectively removed, using the photoresist film 25 as a mask, thereby exposing the bonding electrodes 19a and 19b, as shown in FIG. 2c.

Thus, it is necessary to perform the photoresist process, the photoresist removal process, and the cleaning process five times, respectively, in order to complete a GaN-based semiconductor light emitting device. Such an increased number of photoresist processes to be carried out results in a complexity of the whole process. Furthermore, there is an increased possibility of residual foreign matters after the removal of the photoresist film. The residual foreign matters may degrade the characteristics of the electrode formed in the deposition process.

Moreover, the first and second bonding electrodes must be formed in separate processes using different materials, respectively. For this reason, the number of metal deposition processes for formation of the electrodes is increased, so that the whole process becomes complex.

SUMMARY OF THE INVENTION

The present invention has been made in view of the above mentioned technical problems, and an object of the invention is to provide a method for manufacturing a GaN-based semiconductor light emitting device, which unifies a mesa structure forming process and a transparent electrode forming process while implementing electrode forming processes through a single photoresist process, thereby being capable of simplifying the whole process while making the manufactured semiconductor light emitting device have superior characteristics.

In accordance with one aspect, the present invention provides a method for manufacturing a gallium nitride-based semiconductor light emitting device, comprising the steps of: sequentially forming, over a substrate, a first conductivity type clad layer, an active layer, and a second conductivity type clad layer; forming a transparent electrode over the second conductivity type clad layer; forming a photoresist film on the transparent electrode such that the transparent electrode is exposed at a predetermined region corresponding to one lateral end portion thereof; removing respective portions of the transparent electrode, second conductivity type clad layer, and active layer corresponding to the predetermined region, thereby partially exposing the first conductivity type clad layer; removing the photoresist film; and forming first and second bonding electrodes on predetermined portions of the transparent electrode and second conductivity type clad layer, respectively.

Preferably, the step of partially exposing the first conductivity type clad layer comprises the steps of wet etching the transparent electrode at is portion corresponding to the predetermined region, and dry etching the first conductivity type clad layer and active layer at their portions corresponding to the predetermined region, respectively.

The step of wet etching the transparent electrode may comprise the step of over-etching the transparent electrode such that the transparent electrode is undercut beneath the photoresist film by a predetermined width. Preferably, the predetermined undercut width of the transparent electrode corresponds to at least 3 $\mu$m.

In accordance with another aspect, the present invention provides a gallium nitride-based semiconductor light emitting device manufacturing method in which the step of forming first and second bonding electrodes and the step of forming a passivation layer are carried out, using a single photoresist film. This method comprises the steps of forming a light emitting structure including a substrate, a first conductivity type clad layer formed over the substrate, and an active layer, a second conductivity type clad layer and a transparent electrode sequentially formed on the first conductivity type clad layer at a region corresponding to one lateral portion of the first conductivity type clad layer; forming a passivation layer over the light emitting structure; forming a photoresist film on the passivation layer such that the passivation layer is exposed at predetermined regions where first and second bonding electrodes are to be formed, respectively; etching portions of the passivation layer exposed at the predetermined electrode forming regions, thereby removing the exposed passivation layer portions; forming the first and second bonding electrodes at the predetermined electrode forming regions from which the passivation layer has been removed; and removing the photoresist film.

Preferably, both the first and second bonding electrodes are made of a material selected from a group consisting of Ti/Al, Cr/Au, Cr/Ni/Au, Cr/Pt/Au, and Ti/Al/Ni/Au, so as to provide a light emitting device having characteristics similar to those obtained in the case in which the bonding electrodes are formed using different materials, respectively.

In accordance with another aspect, the present invention provides a gallium nitride-based semiconductor light emitting device manufacturing method in which embodiments according to the above described aspects of the present invention are combined. This method comprises the steps of: sequentially forming, over a substrate, a first conductivity type clad layer, an active layer, and a second conductivity type clad layer; forming a transparent electrode over the second conductivity type clad layer; forming a photoresist film on the transparent electrode such that the transparent electrode is exposed at a predetermined region corresponding to one lateral end portion thereof; etching respective portions of the transparent electrode, second conductivity type clad layer, and active layer corresponding to the predetermined region, thereby partially exposing the first conductivity type clad layer; forming a passivation layer over a light emitting structure obtained after completion of the etching step adapted to partially expose the first conductivity type clad layer; forming a photoresist film on the passivation layer such that the passivation layer is exposed at predetermined regions where first and second bonding electrodes are to be formed, respectively; etching portions of the passivation layer exposed at the predetermined electrode forming regions, thereby removing the exposed passivation layer portions; forming the first and second bonding electrodes at the predetermined electrode forming regions from which the passivation layer has been removed; and removing the photoresist film.

BRIEF DESCRIPTION OF THE DRAWINGS

The above objects, and other features and advantages of the present invention will become more apparent after reading the following detailed description when taken in conjunction with the drawings, in which.

DESCRIPTION OF THE PREFERRED EMBODIMENTS

Now, preferred embodiments of the present invention will be described in detail with reference to the annexed drawings.

FIGS. 3a to 3f are sectional views respectively illustrating processes of a method for manufacturing a GaN-based semiconductor light emitting device.

Figure 3:
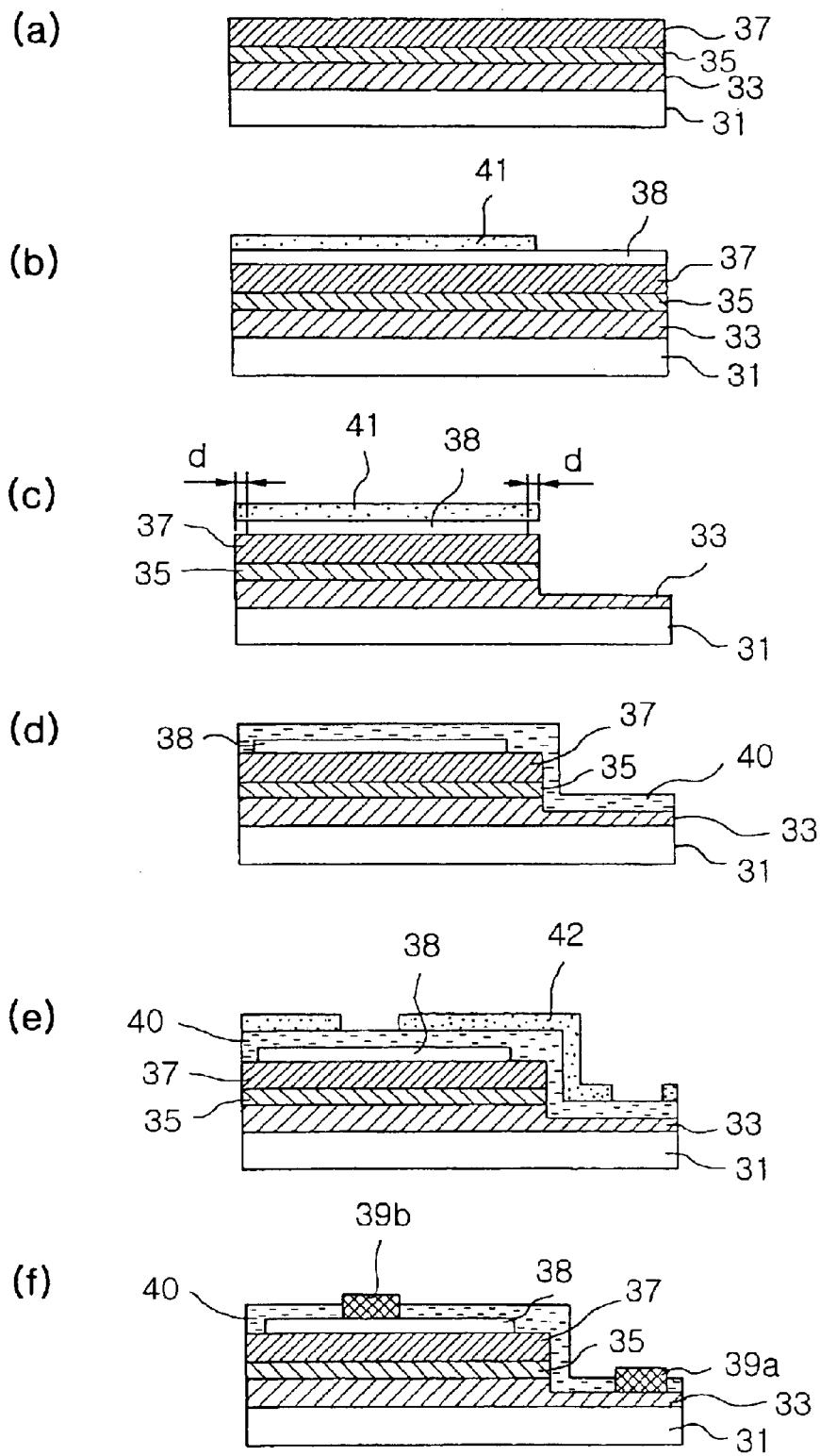
FIGS. 3a to 3f are sectional views respectively illustrating processes of a method for manufacturing a GaN-based semiconductor light emitting device.

In accordance with this semiconductor light emitting device manufacturing method, a primary growth process is first carried out to sequentially form, over a substrate for growth of GaN crystals, that is, a sapphire substrate 31, a first conductivity type clad layer 33, an active layer 35, and a second conductivity type clad layer 37, as shown in FIG. 3a.

The crystalline semiconductor layers 33, 35, and 37 may be grown in accordance with an appropriate process such as an MOCVD process. Prior to the growth of the first conductivity type clad layer 33, a buffer layer (not shown) made of, for example, AlN/GaN, may be formed in order to improve the lattice alignment of the first conductivity type clad layer 33 with the sapphire substrate 31. The first conductivity type clad layer 33 may be comprised of an n type GaN layer and an n type AlGaN layer, whereas the second conductivity type clad layer 37 may be comprised of a p type GaN layer and a p type AlGaN layer. The active layer 35 may be comprised of an undoped InGaN layer having a multi-quantum well structure.

Thereafter, a transparent electrode layer 38 is formed over the second conductivity type clad layer 37, as shown in FIG. 3b. A photoresist film 41 is then formed on the transparent electrode layer 38 such that the transparent electrode layer 38 is exposed at a region corresponding to its one lateral end portion. The transparent electrode layer 38 may be made of an Ni/Au alloy. Preferably, the transparent electrode layer 38 may be comprised of an ITO layer. The exposed region not covered by the photoresist film 41 defines a region where an etching process for forming a mesa structure is to be subsequently carried out in order to partially expose the first conductivity type clad layer 33.

Subsequently, the second conductivity type clad layer 37 and active layer 35 are partially removed in accordance with an etching process at their portions corresponding to the region exposed region not covered by the photoresist film 41, thereby partially exposing the first conductivity type clad layer 33, as shown in FIG. 3c. Thus, the resultant light emitting structure has a mesa structure. In the etching process for removing desired portions of the second conductivity type clad layer 37 and active layer 35, the first conductivity type clad layer 33 may also be partially removed, as shown in FIG. 3c.

The mesa structure forming process involves two etching processes, that is, a primary etching process for removing a portion of the transparent electrode 38 corresponding to the exposed region, and a secondary etching process for removing portions of the second conductivity type clad layer 37 and active layer 35 corresponding to the exposed region. The primary etching process is carried out in accordance with a wet etching method, whereas the secondary etching process is carried out in accordance with a dry etching method.

Figure 1:
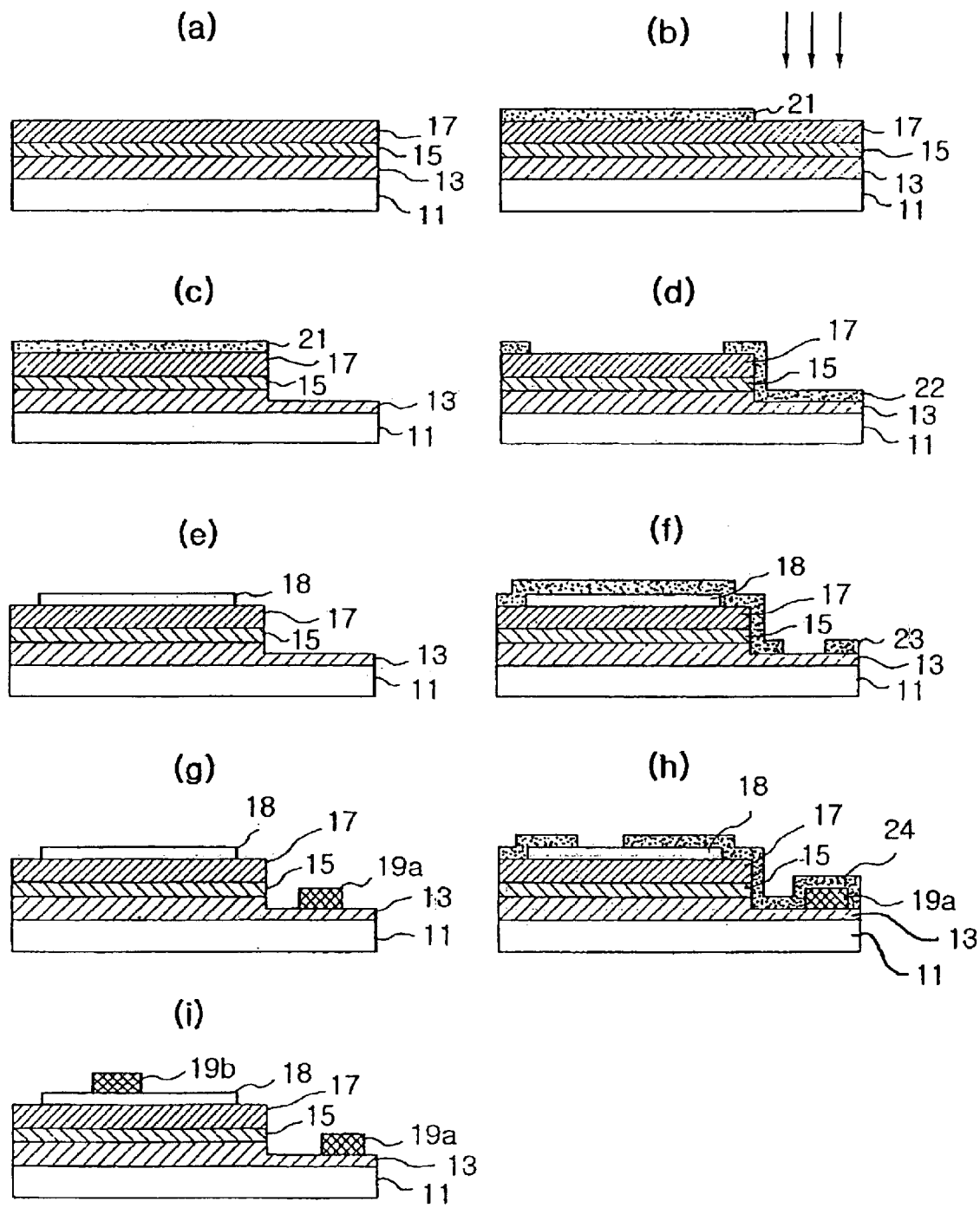
FIGS. 1a to 1i are sectional views respectively illustrating processes of a conventional semiconductor light emitting device manufacturing method.
Figure 2:
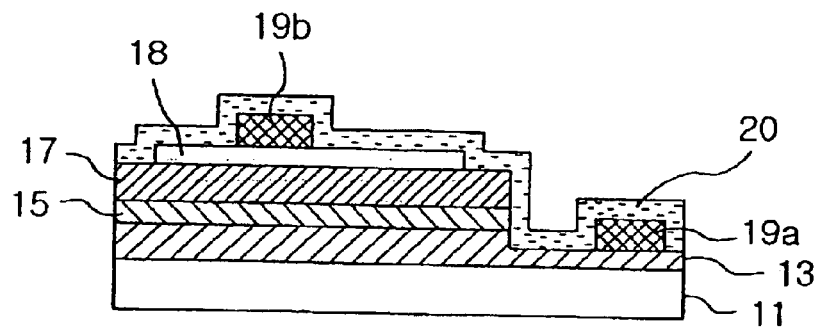
FIGS. 2a to 2c are sectional views respectively illustrating a passivation process included in the conventional semiconductor light emitting device manufacturing method.
Figure 2:
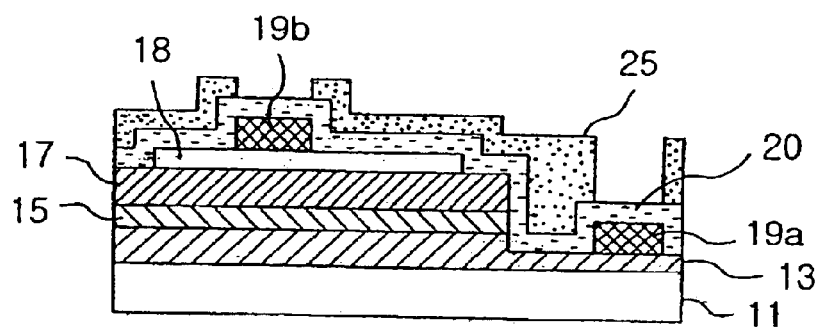
Figure 2:
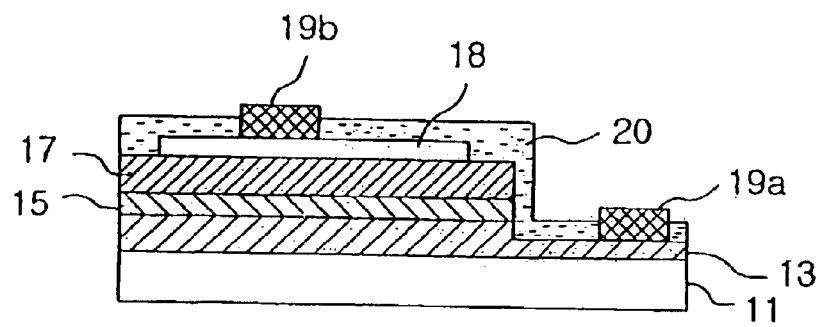

As apparent from the above description, in accordance with the present invention, the mesa structure forming process and the transparent electrode forming process are carried out by use of one photoresist film, that is, the photoresist film 41, so that there is an improvement over the conventional case in which the mesa structure forming process and the transparent electrode forming process are carried out by use of two photoresist films, that is, the photoresist films 21 and 22 of FIG. 1. In accordance with such a unified photoresist film forming process, it is possible to reduce respective numbers of photoresist removal processes and cleaning processes inevitably involved in photoresist film forming processes. In particular, where the transparent electrode is comprised of an ITO film, there is an additional advantage in that the transparent electrode is subjected to sufficient oxidation required for an improvement in transmissivity as it is sufficiently exposed in subsequent processes, because it is formed at a stage earlier than that in the conventional case, that is, at a stage prior to the etching process for formation of the mesa structure.

In the conventional case, different photoresist films are used for the transparent electrode forming process and the mesa structure forming process, respectively, in order to form the transparent electrode such that each edge thereof is spaced apart from an adjacent edge of the second conductivity type clad layer by a certain distance. Generally, the second conductivity type clad layer exhibits a weakness against discharge of static electricity at its sharp edges. Accordingly, it is necessary to form the transparent electrode such that each edge thereof is spaced apart from an adjacent edge of the second conductivity type clad layer, so as to suppress injection of current through the sharp edges. To this end, upon forming the transparent electrode, the conventional case utilizes a separate photoresist film other than the photoresist film used for the formation of the mesa structure.

In accordance with the present invention, however, it is possible to form the transparent electrode 38 such that each edge thereof is spaced apart from an adjacent edge of the second conductivity type clad layer 37 by a predetermined distance d, while using a single photoresist film, that is, the photoresist film 41, for both the patterning of the transparent electrode 38 and the formation of the mesa structure. This can be achieved by performing the wet etching process for partially removing the transparent electrode 38, in an over-etching manner, such that the transparent electrode 38 arranged beneath the photoresist film 41 is undercut by a predetermined width d. Preferably, the predetermined width d is at least 3 $\mu$m in order to prevent discharge of static electricity.

Thereafter, processes for forming a passivation layer and bonding electrodes in accordance with the present invention are carried out. These processes are illustrated in FIGS. 3d to 3f.

A passivation layer 40 is first formed over the entire upper surface of the light emitting structure, obtained after completion of the process shown in FIG. 3c and removal of the photoresist film 41, including respective exposed surfaces of the transparent electrode 38, and first and second conductivity type clad layers 33 and 37, as shown in FIG. 3d. As is well known, the passivation layer 40 may be made of an appropriate material such as $SiO_2$ or SiN.

A photoresist film 42 is then formed on the passivation layer 40 such that the passivation layer 40 is exposed at regions where bonding electrodes are to be formed, respectively, as shown in FIG. 3e. The bonding electrode forming regions correspond to regions where desired portions of the transparent electrode 38 and first conductivity type clad layer 33 are positioned. These regions are arranged so that they are spaced apart from each other by a sufficient distance while being symmetrically arranged.

Thereafter, the exposed portions of the passivation layer 40 are etched, using the photoresist film 42 as a mask, so that they are removed, thereby exposing corresponding portions of the transparent electrode 38 and first conductivity type clad layer 33. Subsequently, a bonding electrode 39a for a p type conductivity and a bonding electrode 39b for an n type conductivity are formed on the exposed portions of the transparent electrode 38 and first conductivity type clad layer 33, respectively, as shown in FIG. 3f. Thus, a GaN-based semiconductor light emitting device is completed.

As described above, the processes for forming the passivation layer and bonding electrodes are carried out, using only one photoresist film, that is, the photoresist film 42, in accordance with the present invention. Therefore, it is preferable to use the same metallic material for both the electrodes 39a and 39b in the bonding electrode forming process, so as to simultaneously form the electrodes 39a and 39b. For the electrode forming material, Ti/Al, Cr/Au, Cr/Ni/Au, Cr/Pt/Au or Ti/Al/Ni/Au may be used.

In accordance with the present invention, the photoresist film 42 for formation of the bonding electrodes is formed under the condition in which the passivation layer 40 has been formed. Also, the bonding electrodes are formed at regions from which the passivation layer 40 is removed, using the photoresist film 42 as a mask. Accordingly, there is no or little photoresist at the electrode forming regions after removal of the passivation layer 40, even when the photoresist film 42 is incompletely removed. Therefore, it is possible to solve a problem of a degraded bonding force of the bonding electrodes caused by residual photoresist. It is also possible to dispense with cleaning processes. The above mentioned problem may also occur in the transparent electrode forming process, as described above in conjunction with FIGS. 1d and 1e. In accordance with the present invention, however, the problem caused by residual photoresist can be solved because a desired photoresist film is formed after formation of the transparent electrode, as described in conjunction with FIGS. 3b and 3c. Also, it is possible to improve the bonding force of the transparent electrode.

The improvement in the bonding forces of the transparent electrode and bonding forces achieved along with a process simplification in accordance with the present invention may also contribute to an improvement in the reliability of the finally obtained device. Where the bonding electrodes were practically made of the same metal, for example, a Ti/Au alloy, without using different metals suitable to respective associated clad layers, in accordance with the present invention, the resultant light emitting device exhibited characteristics (a forward voltage of 3.25 V and an optical efficiency of 12.2 mcd at 20 mA) substantially similar to those of conventional light emitting devices (a forward voltage of 3.29 V and an optical efficiency of 12.4 mcd).

Although the embodiment illustrated in FIGS. 3a to 3f has been described as a combination of the embodiment (FIGS. 3a to 3c) in which the transparent electrode forming process and the mesa structure forming process are unified, and the embodiment (FIGS. 3d to 3f) in which the passivation layer forming process and the bonding electrode forming process are unified, it may be implemented under the condition in which the embodiments of FIGS. 3a to 3c and FIGS. 3d to 3f are separately implemented. For example, the embodiment of FIGS. 3a to 3c may be implemented in a state of being combined with conventional processes of forming a passivation layer and bonding electrodes. Also, the embodiment of FIGS. 3d to 3f may be implemented in a state of being combined with conventional processes of forming a mesa structure and a transparent electrode.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

As apparent from the above description, the present invention provides a method for manufacturing a GaN-based semiconductor light emitting device, which is capable of implementing processes for forming a mesa structure and a transparent electrode by use of a single photoresist film, thereby simplifying those processes, implementing processes for forming a passivation layer and electrodes by use of a single photoresist film, thereby simplifying the whole process, easily forming a transparent electrode pattern suitable to prevention of electrostatic discharge (ESD), in accordance with an over-etching process, and preventing a degradation in the bonding forces of the transparent electrode and bonding electrodes caused by residual photoresist.

What is claimed is:

1. A method of manufacturing a gallium nitride-based semiconductor light emitting device, said method comprising the steps of:
    sequentially forming, over a substrate, a first conductivity type clad layer, an active layer, and a second conductivity type clad layer;
    forming a transparent electrode over the second conductivity type clad layer;
    forming a first photoresist film on the transparent electrode such that the transparent electrode is exposed in a predetermined region corresponding to one lateral end portion thereof;
    removing respective portions of the transparent electrode, the second conductivity type clad layer, and the active layer corresponding to the predetermined region, thereby partially exposing the first conductivity type clad layer;
    removing the first photoresist film; and
    forming first and second bonding electrodes on predetermined portions of the transparent electrode and the second conductivity type clad layer, respectively, by the steps of:
        forming a passivation layer over a light emitting structure obtained after completion of the formation of the transparent electrode;
        forming a second photoresist film on the passivation layer such that the passivation layer is exposed in electrode forming regions where the first and second bonding electrodes are to be formed, respectively;
        removing, by etching, portions of the passivation layer in the electrode forming regions;
        forming the first and second bonding electrodes in the electrode forming regions from which the passivation layer has been removed, respectively; and
        removing the second photoresist film.

2. The method according to claim 1, wherein in the step of partially exposing the first conductivity type clad layer:
    the respective portion of the transparent electrode is removed by wet etching; and
    the respective portions of the first conductivity type clad layer and the active layer are removed by dry etching.

3. The method according to claim 2, wherein said wet etching comprises over-etching the transparent electrode such that the transparent electrode is undercut beneath the photoresist film by a predetermined width.

4. The method according to claim 3, wherein the predetermined undercut width of the transparent electrode corresponds to at least 3 μm.

5. A method for manufacturing a gallium nitride-based semiconductor light emitting device, comprising the steps of:
    forming a light emitting structure including a substrate, a first conductivity type clad layer formed over the substrate, and an active layer, a second conductivity type clad layer and a transparent electrode sequentially formed on the first conductivity type clad layer at a region corresponding to one lateral portion of the first conductivity type clad layer;

forming a passivation layer over the light emitting structure;

forming a photoresist film on the passivation layer such that the passivation layer is exposed at predetermined regions where first and second bonding electrodes are to be formed, respectively;

etching portions of the passivation layer exposed at the predetermined electrode forming regions, thereby removing the exposed passivation layer portions;

forming the first and second bonding electrodes at the predetermined electrode forming regions from which the passivation layer has been removed; and removing the photoresist film.

6. The method according to claim 5, wherein the first and second bonding electrodes are made of a material selected from a group consisting of Ti/Al, Cr/Au, Cr/Ni/Au, Cr/Pt/Au, and Ti/Al/Ni/Au.

7. A method for manufacturing a gallium nitride-based semiconductor light emitting device, comprising the steps of:

sequentially forming, over a substrate, a first conductivity type clad layer, an active layer, and a second conductivity type clad layer;

forming a transparent electrode over the second conductivity type clad layer;

forming a photoresist film on the transparent electrode such that the transparent electrode is exposed at a predetermined region corresponding to one lateral end portion thereof;

etching respective portions of the transparent electrode, second conductivity type clad layer, and active layer corresponding to the predetermined region, thereby partially exposing the first conductivity type clad layer;

forming a passivation layer over a light emitting structure obtained after completion of the etching step adapted to partially expose the first conductivity type clad layer;

forming a photoresist film on the passivation layer such that the passivation layer is exposed at predetermined regions where first and second bonding electrodes are to be formed, respectively;

etching portions of the passivation layer exposed at the predetermined electrode forming regions, thereby removing the exposed passivation layer portions;

forming the first and second bonding electrodes at the predetermined electrode forming regions from which the passivation layer has been removed; and removing the photoresist film.

* * * * *